(12) United States Patent
Haughey et al.

(10) Patent No.: US 11,766,621 B2
(45) Date of Patent: Sep. 26, 2023

(54) MAGNET HOLDER AND SYSTEM

(71) Applicant: Tegu, Darien, CT (US)

(72) Inventors: Christopher Harwood Haughey, Lutz, FL (US); Nathaniel Scott Lau, Mountain View, CA (US)

(73) Assignee: Tegu, Darien, CT (US)

( * ) Notice: Subject to any disclaimer, the term of this patent is extended or adjusted under 35 U.S.C. 154(b) by 0 days.

(21) Appl. No.: 18/093,526

(22) Filed: Jan. 5, 2023

(65) Prior Publication Data

US 2023/0149823 A1 May 18, 2023

Related U.S. Application Data

(62) Division of application No. 16/372,842, filed on Apr. 2, 2019, now Pat. No. 11,547,948.

(51) Int. Cl.
| | | |
|---|---|---|
| *A63H 17/26* | (2006.01) | |
| *A63H 19/18* | (2006.01) | |
| *A63H 33/04* | (2006.01) | |
| *A63H 33/26* | (2006.01) | |
| *E05C 19/16* | (2006.01) | |
| *H01L 21/673* | (2006.01) | |
| *F16B 1/00* | (2006.01) | |

(52) U.S. Cl.
CPC .......... *A63H 17/264* (2013.01); *E05C 19/16* (2013.01); *A63H 19/18* (2013.01); *A63H 33/046* (2013.01); *A63H 33/26* (2013.01); *F16B 2001/0035* (2013.01); *H01L 21/67376* (2013.01)

(58) Field of Classification Search
CPC .... A63H 17/264; A63H 33/046; A63H 33/26; F16B 2001/0035

USPC .......................... 446/92, 129, 132, 137, 139
See application file for complete search history.

(56) References Cited

U.S. PATENT DOCUMENTS

| | | | | |
|---|---|---|---|---|
| 4,754,532 A | * | 7/1988 | Thomson | B63H 8/54 24/303 |
| 5,190,325 A | * | 3/1993 | Doss-Desouza | E05C 19/16 292/DIG. 60 |
| 5,473,799 A | * | 12/1995 | Aoki | E05C 19/16 24/66.1 |
| 5,681,202 A | * | 10/1997 | Sander | A63H 17/264 213/75 D |
| 6,749,480 B1 | * | 6/2004 | Hunts | A63H 33/046 446/85 |
| 7,217,059 B1 | * | 5/2007 | Rudduck | F16B 5/0664 403/324 |

(Continued)

*Primary Examiner* — Joseph B Baldori
(74) *Attorney, Agent, or Firm* — Mitchell Intellectual Property Law, PLLC

(57) ABSTRACT

A magnet holder insert comprising a magnet and magnet holder housing designed with internal wall features capable of keeping the magnet properly positioned in the holder device, and external wall features capable of keeping the magnet holder device securely mounted in the finished part. The internal and external fastening elements of the magnet holder housing are designed in such a way as to promote rapid and secure assembly of both the magnet device and the finished part. The exposed surface of the magnet holder device can be configured with flat or dome shaped exposed contact surfaces, depending on how secure or flexible the magnetic joining feature is intended, capable of attaching to another magnet device or a material susceptible to magnetic attraction.

5 Claims, 6 Drawing Sheets

(56) References Cited

U.S. PATENT DOCUMENTS

| | | | | |
|---|---|---|---|---|
| 7,758,398 B2* | 7/2010 | Park | ............... | A63H 33/046 446/131 |
| 7,985,116 B2* | 7/2011 | Song | ............... | A63H 33/046 446/92 |
| 8,016,635 B2* | 9/2011 | Park | ............... | A63H 33/046 446/131 |
| 8,016,636 B2* | 9/2011 | Park | ............... | A63H 33/046 446/131 |
| 8,070,550 B2* | 12/2011 | Song | ............... | A63H 33/046 446/92 |
| D669,941 S * | 10/2012 | Kim | ............... | F16B 5/0664 D8/382 |
| 8,376,420 B2* | 2/2013 | Peterlunger | ......... | E05C 19/165 292/DIG. 4 |
| 8,915,371 B2* | 12/2014 | Giocastro | ............ | B65D 51/28 206/538 |
| 9,729,185 B2* | 8/2017 | Scully | ............... | F16M 13/022 |
| 2006/0111010 A1* | 5/2006 | Park | ............... | A63H 33/046 446/92 |
| 2010/0040410 A1* | 2/2010 | King | ............... | A47C 17/86 403/361 |
| 2010/0120322 A1* | 5/2010 | Vicentelli | ........... | A63H 33/046 446/92 |
| 2015/0187480 A1* | 7/2015 | Chaizy | ............... | E05B 47/00 403/66 |
| 2015/0298020 A1* | 10/2015 | Shin | ............... | A63H 33/046 446/92 |
| 2016/0145925 A1* | 5/2016 | Salice | ............... | E05F 5/06 312/334.44 |
| 2017/0335604 A1* | 11/2017 | Liang | ............... | E05B 47/00 |

* cited by examiner

MAGNET HOLDER AND SYSTEM

CROSS REFERENCE TO RELATED APPLICATIONS

The present application claims the benefit of U.S. application Ser. No. 16/372,842 filed Apr. 2, 2019, entitled MAGNET HOLDER AND SYSTEM, which is allowed.

BACKGROUND OF THE INVENTION

Magnet holder inserts are used in a wide variety of applications providing a means of attaching one or more objects together with a reasonable amount of magnetic bonding strength. Most magnet holder inserts require the addition of some type of a protective outer coating or cover to protect the magnets themselves from physical damage and keep the magnets in place. U.S. 2016/0145925 is an example of such a holder with a screw on cap to lock the magnet in position in the holder. The holder includes external ribs which help hold the holder in position within an opening or hole in the article to which the magnet is to be attached.

U.S. 2006/01101010 discloses in FIGS. 27, 28 and 29 a cylindrical magnet holder having a top wall 200a and an open bottom through which a magnet 110b can be inserted into the holder. The holder is inserted into a hole in the article with the top wall, preventing escape of the magnet, and barbs 252b on the exterior of the cylindrical wall of the holder holding it in place in the receiving hole of the article.

Other magnet holders are typically made by either gluing the magnets into a protective holder and then gluing it onto or into an object to create a final part or they use a screw or shank type fastening system with a protective head which is attached through a hole in the magnet into the final part. (e.g. 5681202). In many of these cases there are extra steps and costs added to the assembly process and the potential for unplanned assembly failures in finished parts under normal use. In cases where the magnets are attached to the finished part using a shank type fastening element a hole in the magnet is required to allow the shank to pass through it, the presence of a hole in the magnet will change the magnetic field pattern and can significantly reduce the magnetic field strength.

In other cases where adhesive methods are used to build the magnet holder insert and/or final assembly, there are significant hurdles related to maintaining proper adhesion over time due to the dissimilar nature of the materials involved. In many cases the body of the finished part may be fabricated from cellulosic wood materials, while the magnet may be a ferrite powder mixed in a rubber or polymer matrix, and the protective covering feature made from an engineered plastic material.

SUMMARY OF THE INVENTION

The present invention relates to magnet holders for use in mounting magnets in furniture, toys, containers, boxes, and the like. The magnet holder of the present invention comprises hollow housing with a top wall, a side wall or walls, and an open bottom through which a magnet can be inserted. The internal surface of the hollow housing is designed with at least one or more inwardly projecting retainers designed to allow the magnet to be press fit fully into the housing and held firmly in place during assembly and normal use. A single retainer includes space to either side, and multiple retainers are spaced so that air passes through said spaces as a magnet is pressed into position past said retainer or retainers. The external surface of the hollow housing side wall is also designed with multiple ribs, preferably with spaced gaps therein, which allow the magnet holder assembly to be easily press fit into a finished part and held firmly in place during normal use.

BRIEF DESCRIPTION OF THE DRAWINGS

Potential configurations of the invention are illustrated in the included drawings by way of example and not by way of limitation in the figures of the drawings.

DETAILED DESCRIPTION OF THE PREFERRED EMODIMENT

Figure 1:
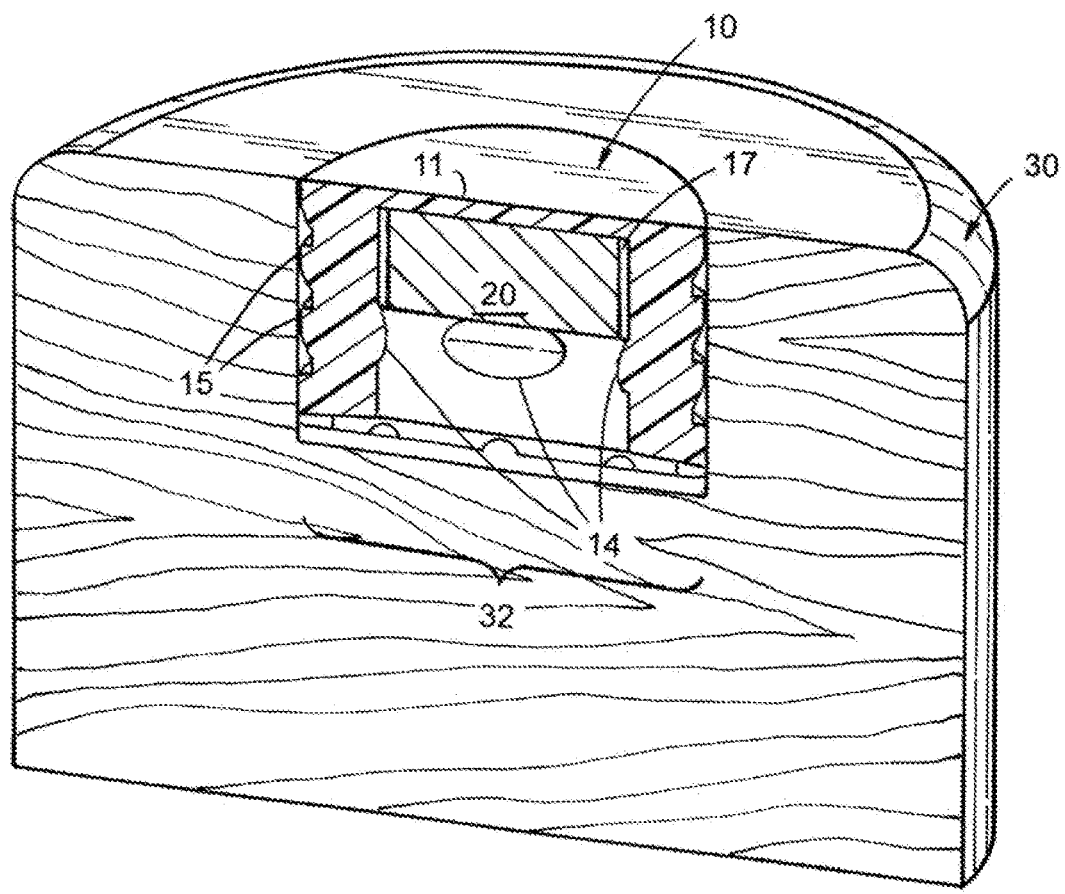
FIG. 1 is a side cutaway view showing a magnet holder inserted into round finished part.

The magnet holder of the preferred embodiment comprises a hollow molded plastic housing 10, preferably cylindrical in shape with a top 11, cylindrical side wall 12, and an open bottom 13 through which a circular disk magnet 20 can be inserted. (FIGS. 1 and 3) The terms top and bottom refer to the orientation of the components as shown in the drawings, rather than spatial orientation in use, which will vary. The terms holder and housing are used interchangeably and are identified by the numeral 10. In FIG. 1 magnet (20) has been press fit into the bottom of housing (10) to form a magnet holder insert 10/20, which as shown is press fit into an article (30). It could be press fit into any article for which magnetic action is desired, e.g. a block or body of a toy, or an article of furniture to provide a magnetic door latch, etc. The term "magnet holder insert 10/20" is used herein to refer to the housing 10 with magnet 20 inserted therein. The article can be of any solid substrate (e.g. wood, plywood, MDF, plastic, metal, composite, drywall, etc. materials).

Figure 11:
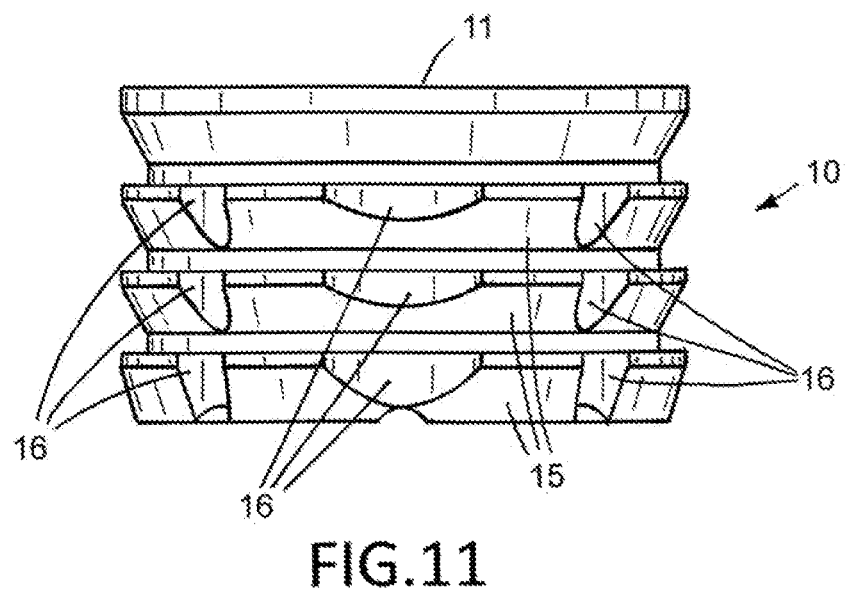
FIG. 11 is a side elevation of the housing turned one quarter turn from the view shown in FIG. 10 and showing a larger inwardly sloping angle on the reverse sloped retainer rings 15.

The cylindrical side wall exterior (12) includes at least one, preferably two to four, and most preferably three reverse sloped retainer rings (15) designed to allow the magnet holder to be press fit into receiving holes/cavities 32 in article 30 and provide structural integrity to keep holder insert 10/20 in place and stable under normal use of article 30. (FIGS. 1, 3, 8 and 11) The angle on the reverse slope of retainer rings 15 can vary. In FIG. 11, the angle on retainer rings 15 slopes inwardly more to facilitate ease of locating the housing in the receiving opening 32 intended for it. The housing can be located a bit off center and still enter receiving opening 32. The housing then centers itself in opening 32 as it is pressed into place.

Figure 2:
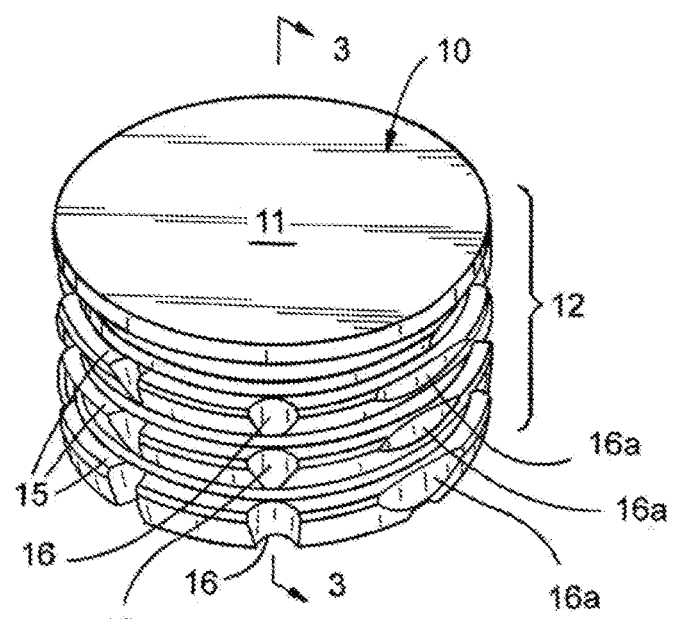
FIG. 2 is a perspective view of a cylindrical housing for the magnet holder insert prior to insertion.
Figure 3:
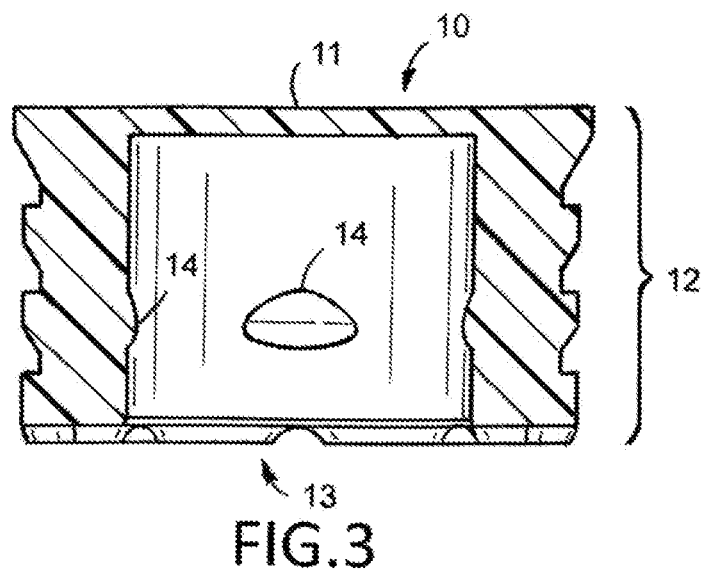
FIG. 3 is a lateral cross-sectional view showing a cylindrical housing for the magnet holder.
Figure 4:
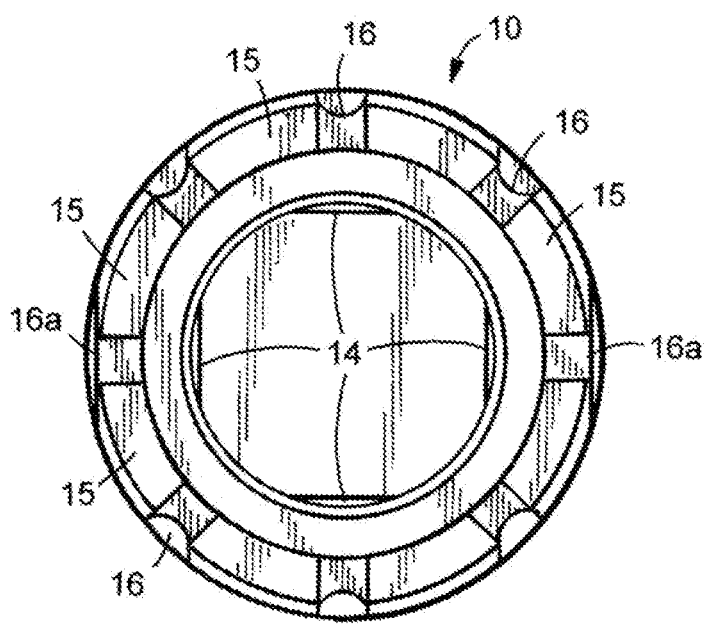
FIG. 4 is a bottom view of a cylindrical housing for the magnet holder.
Figure 5:
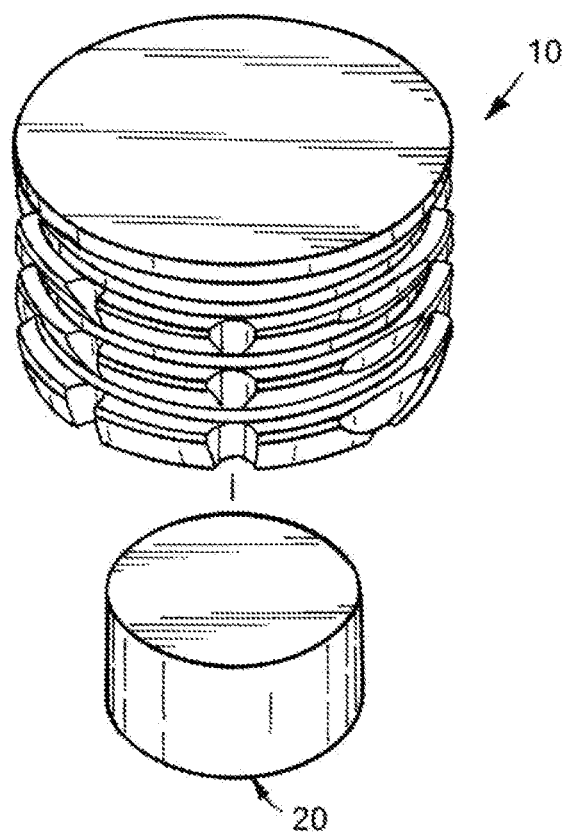
FIG. 5 is an exploded view of the cylindrical housing and cylindrical magnet prior to assembly.
Figure 6:
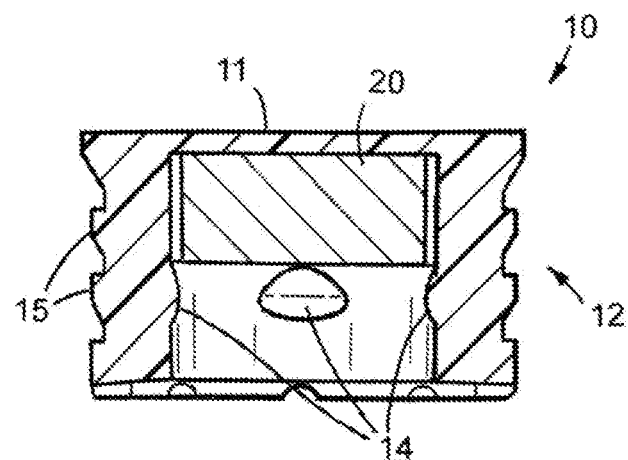
FIG. 6 is a lateral cross-sectional view of the magnet holder housing with magnet positioned therein.
Figure 10:
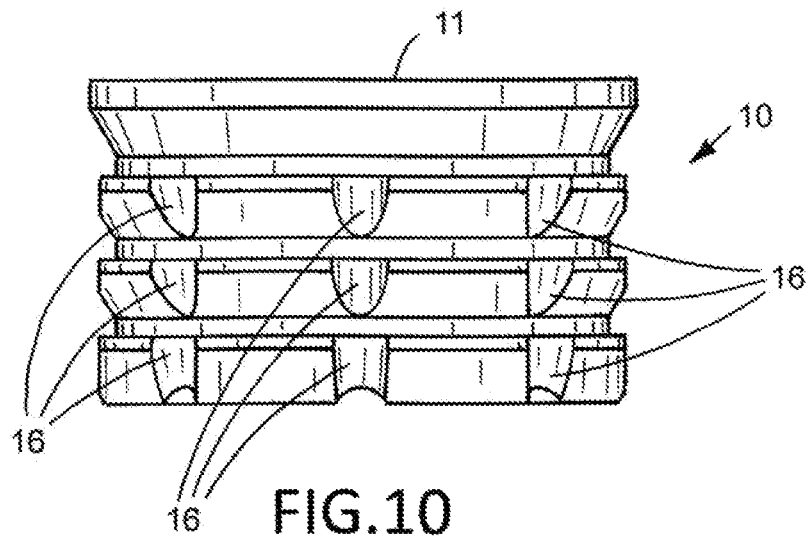
FIG. 10 is a side elevation of the housing.

There are also at least one, preferably at least four, and most preferably eight spaced gaps (16 and 16a) in the retainer rings (15) to allow for air to escape from the inside of the cylinder when the magnet holder insert 10/20 is press fit into position in a receiving hole 32 in article 30. (FIGS. 1-4, 10 and 11) Gaps 16 are relatively narrow notches formed in rings 15. Gaps 16a are formed on opposite sides of housing 10 as flats in the otherwise circumferential perimeter of rings 15. These flats make gaps 16a shallower than gaps 16, but somewhat wider, even though still relatively narrow. (Compare FIGS. 10 and 11.) The flats forming gaps 16a provide a flat gripping surface on opposite sides of housing 10, making it possible for holders 10 to be gripped at the opposite flats and given a desired location and spatial orientation. Preferably, the gaps 16 and 16a in the successive rings are aligned vertically with one another. (FIGS. 2 and 4) As can be seen in FIG. 4, eight of said gaps 16 and 16a are uniformly spaced around said retainer rings. The rings 15 are continuous around side wall 12. The gaps occupy from about 10% to about 20% of the linear perimeter of each ring 15. The dimensions, e.g. inner diameter of a receiving insert hole 32 is just slightly smaller than the outer diameter of rings 15, such that a force fit is required to insert the holder inserts 10/20 into a hole 32. Representative dimensions are as follows: Inner diameter of hole 32 of 10 mm, and outer diameter of rings 15 of 10.20 mm.

Figure 8:
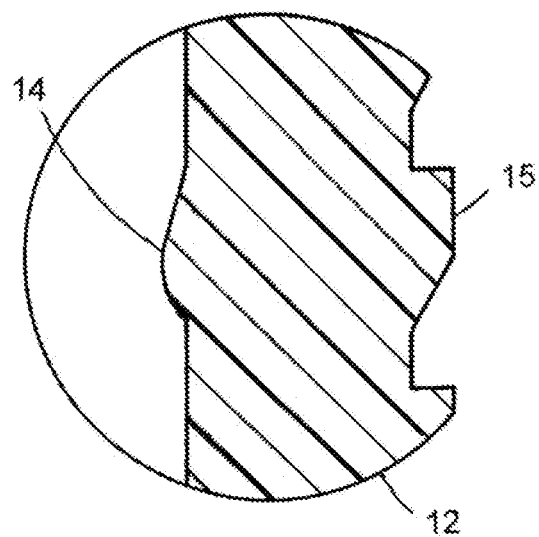
FIG. 8 is a close-up view of the cylindrical housing side wall features.

There is at least one, and preferably at least two spaced retainers (14) positioned on the smooth inside surface of the cylindrical housing wall 12 hold magnet 20 in place following assembly into the interior of housing 10. (FIGS. 1, 3 and 8). The interior dimensions, e.g. diameter, of 1 housing 10 are/is just slightly greater than the outer dimension of magnet 20, at least in vicinity of said retainers 14, and said retainers project inwardly a distance which extends slightly beyond the outer dimension of magnet 20. Preferably the spacing 17 between, wall 12 and the perimeter of magnet 20 is uniform throughout, except for the inward protrusion of retainers 14 extending inward from the inner surface of wall 12 and beyond the perimeter of the magnet. (However, the spacing dimension could be greater in areas remote from retainers 14.) Exemplary dimensions for the interior of the housing, the diameter of the magnet, and the distance of projection of retainers 14 are as follows:

Outer diameter of magnet 20 of 6.00 mm, an inner diameter of housing wall 12 of 6.10 mm, and retainer 14 extending 0.10 mm inward from the inner housing wall 12. Preferably, at least two of said retainers are generally opposite one another on said inner wall, such that the distance between them is slightly narrower than the diameter of a magnet 20 to be inserted between them. In this example, the diameter of magnet 20 is 6.00 mm, and the distance between said at least two retainers is 5.9 mm, thus providing support for said magnet 20 when it has been inserted past them and is located above them.

As a result, magnet 20 can be pressed into the housing through the bottom opening (13), over and past the retainers 14. The retainers 14 are not continuous around the circumference of the housing, allowing space to either side of the retainers for air to escape around the perimeter of the magnet 20 past a single retainer or between multiple retainers 14 through spacing 17 between the magnet 20 and the inside surface of the cylindrical housing wall 12 as magnet 20 is pressed into position. Two or more retainers 14 provide for a secure fit of the magnet 20 against the bottom of the top wall 11 during normal use conditions. In the preferred embodiment a total of four retainers 14 are symmetrically placed to provide for adequate air escape openings while maintaining stable magnet placement. The preferred shape of this retainer 14 is such that it allows for a secure snap fit effect when the magnet 20 is press fit into the housing 10.

The shape of projecting retainers can vary. In a preferred embodiment, retainers 14 are inwardly projecting dimples.

The top wall 11 acts as the positioning stop for the magnet and is designed to keep the magnet in place and protect the magnet from physical damage. (FIGS. 1 and 3). Preferably, the dimensions of the housing interior from retainers 14 to top wall 11 are such that when magnet 20 is pressed into the housing 10 it contacts top wall 11 of the housing, and rests against retainers 14, which holds magnet 20 firmly in place and prevents it from rattling around in housing 10 interior in use. (FIG. 1).

The top wall 11 of housing/holder 10 is designed to be thick enough to hold the magnet in place within housing 10, and to protect the magnet surface, and thin enough that a smaller magnet can be used to achieve the same attractive force of a larger magnet behind a thicker wall. The thickness of the top wall 11 is typically only 0.5 millimeters thick and is made of a plastic material which is not magnetic. A thinner top wall 11 means the magnet 20 will be closer to the outer surface of top wall 11 and the magnet 20 can be a smaller magnet and yet achieve the same attractive force of a larger magnet behind a thicker wall. The wall 11 thickness is optimally determined based on a) the structural strength requirements, based on the intended application and the insert 10 material selection, and b) the magnet 20 strength. There is a desire to optimize the magnet 20 and insert 10 materials to minimize part costs while maintaining ease of assembly and finished durability.

Housing 10 is preferably made of a rigid but slightly resiliently compressible plastic material, such that exterior rings 15 compress/flex slightly as the magnet holder insert 10/20 is press fit into position within a hole/cavity 32 formed or drilled into the article 30 for receiving the magnet holder insert. In the preferred embodiment shown, the hole/cavity is a cylindrical hole having a diameter slightly smaller than the diameter of the rings 15, such that rings 15 compress and/or deflect somewhat as holder insert is pressed into the hole/cavity. This provides an adhesive free fit of the holder insert into article 30. The depth of said holes are typically equal to, or slightly deeper than the length of the housing side wall 12. Preferably, the depth of the hole is essentially the same as the length of the housing side wall 12.

Similarly, the slightly resiliently compressible plastic material allows the cylindrical wall 12 to flex slightly, and/or retainers 14 to compress slightly, as magnet 20 is pushed past them and into position within housing 10. An exemplary plastic material is: ABS plastic with UV stabilizers.

Figure 7:
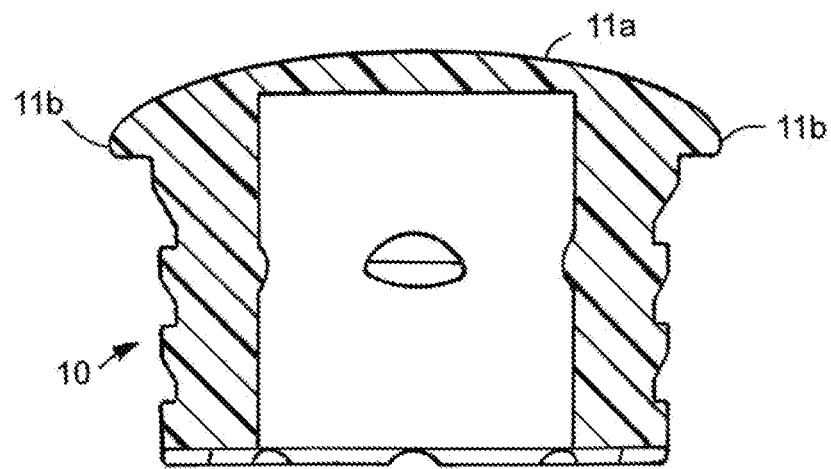
FIG. 7 is a sectional view of the magnet holder with a domed top.

FIG. 7 shows an alternative embodiment housing 10 designed with a top wall 11a that is slightly convex. There are many situations where it is desirable to provide some degree of freedom of movement between the magnet holder insert and the surface to which it is attached. In such situations a slightly convex shaped top wall 11a which protrudes outward from the finished part 30 surface can be used to allow the finished part to stay in direct contact with another solid surface, such as a magnetic part with opposite polarity or a surface susceptible to magnetic attraction, even if the finished part is not directly aligned with the contacted solid surface. This is a desirable feature in moving parts, such a magnetic coupling between two or more finished parts, where it is important to maintain contact even when alignment between the parts varies in either the horizontal or vertical plane. Top wall 11a also typically extends a little beyond side-wall 12 at rim 11b, which serve as a stop against the top surface of article 30 during insertion into surrounding hole 32. The flat surface of a punch tool used to insert holder 10 with top 11a can't push holder 10 too far into hole 32 because rim 11b won't let it. Where top wall 11 is flat, it does not have to have a surrounding rim to limit depth of insertion. A flat punch can be used which is larger in diameter than holder 10, such that engagement of the edges of the punch with the top surface of article 30 limits further insertion of holder 10.

Figure 9:
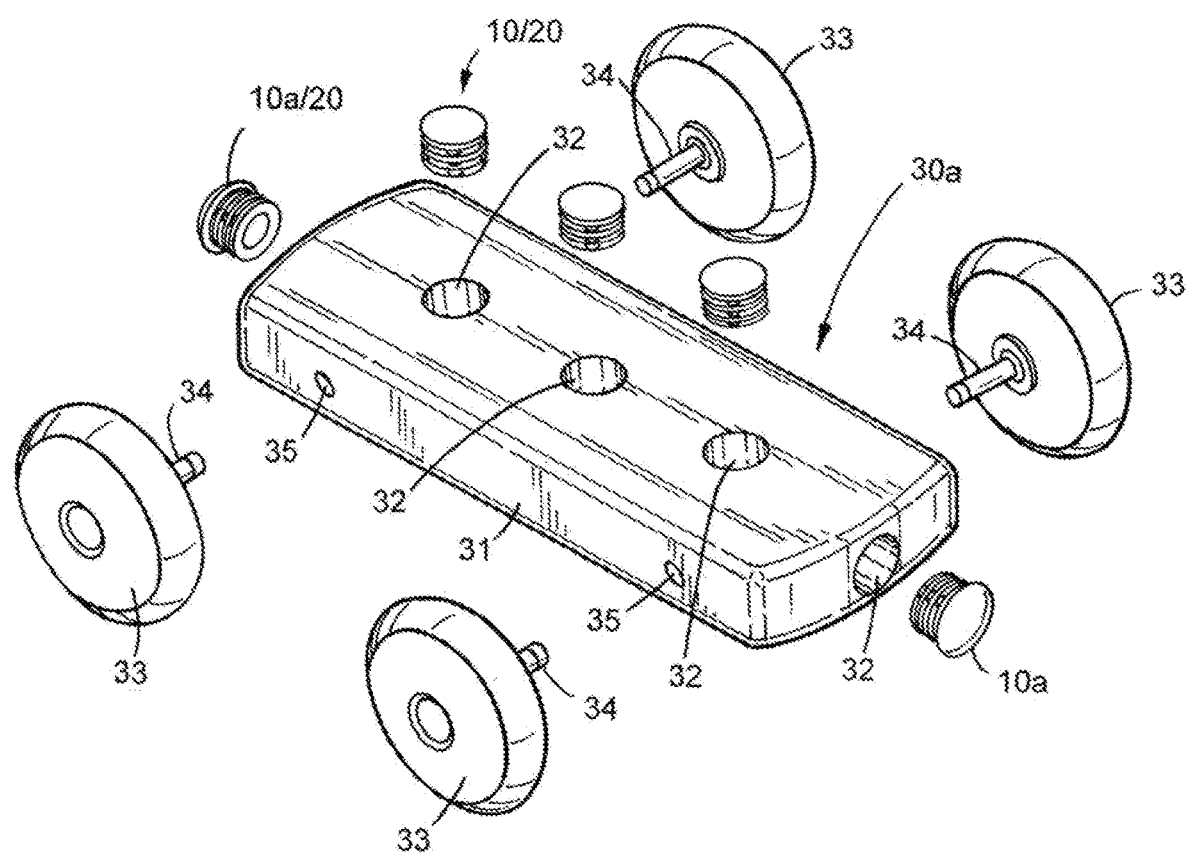
FIG. 9 is an exploded view of a toy car with multiple magnet containing magnet holders deployed for insertion into bores located at various points on the toy.

FIG. 9 shows an exploded view example of one embodiment of this invention. Presented is an assembly view of a toy wagon 30a capable of being magnetically coupled to one or more other toy wagons, and capable of carrying on its top up to 3 separate toy components with a magnetically affected surface. The wagon 30a has a body 31 supported by wheels 33 having axle stems 34 which can be pressed into axel holes 35 in the sides of body 31.

Three holes 32 are formed or drilled into the top of body 31, and another hole 31 is formed or drilled into each end of body 31. Three magnet holder inserts 10/20 are inserted into top holes 32. Another insert 10a/20, but with a domed/convex top 11a is inserted in an end hole at each end of body 31. This allows this toy part to remain directly connected to a second toy part, of opposite magnetic polarity even if the toy parts do not stay perfectly aligned during use. In situations where a series of directly connected toys are on a track which has turns or is not perfectly aligned the convex top 11a provides a significant degree of freedom to accommodate such design elements without losing direct contact. Using a convex shape rather than a simple half round shape allows for degree of freedom compensation in both the horizontal plane and the vertical plan simultaneously.

On this toy example, the top surface of the toy body 31 is intended to have other toy components stacked on top of toy 30a. In this case it is desirable to use the flat top 11 holder which aligns flush with the top surface of the toy such that any flat surfaced object with magnetic tendencies can become directly attached to the magnet holder 10 surface.

There may also be cases where a specific alignment of two mating surfaces is desired. In such cases the magnetic housing top 11 can be constructed with a various ridge style patterns, and the mating part constructed with a reverse image of said ridge style pattern, such that when the two are coupled they remain in a specific alignment configuration until sufficient force is applied to break the magnetic coupling.

Because of the present invention, an article such as a toy, furniture or the like can be fitted with magnets using the magnet holder inserts of the present invention. The retainers on the interior wall allows magnets to be easily inserted into the holder and held in place without adhesive. Similarly, the external ribs on the housing with air passage spacings therein allow the magnet holder insert to be easily force fit into a receiving aperture in the article, which in turn is held in place without adhesive.

The forgoing is a description of exemplary preferred embodiments of the invention, and it is to be understood that variations thereof can be used without departing broader concepts and spirit of the invention.

The invention claimed is:

1. A method of manufacturing an article having magnets embedded in it comprising: forming a magnet receiving cavity in said article; providing a plastic magnet holder for firmly holding a magnet and for insertion of said plastic magnet holder, with a magnet held firmly in place therein, into said magnet receiving cavity in said article, said magnet holder being dimensioned to fit tightly into said magnet receiving cavity, said plastic magnet holder comprising: a plastic housing having a top wall, a side wall or walls depending downwardly from said top wall defining an open interior in said housing, and an open bottom, such that a magnet can be inserted up into said interior of said housing; the interior surface of said side wall or walls including at least one interior retainer projecting inwardly into said interior of said housing at a distance below said top wall sufficient to accommodate and retain firmly in place a magnet located between said at least one interior retainer and said top wall; said at least one interior retainer projecting inwardly a distance which extends sufficiently far beyond the outer dimensions of the magnet to be placed in said housing that the magnet has to be forced past said at least one interior retainer in order to position and hold it firmly in place between said at least one interior retainer and said top wall; the dimensions of said interior space of said housing being slightly greater than the dimensions of a magnet to be located therein, and said at least one interior retainer including a space to either side, such that air is allowed to escape from said interior of said housing past the perimeter of the magnet as it is forced over said at least one interior retainer; inserting a tight fitting magnet into said magnet holder by forcing it past said interior retainer whereby said magnet is retained in said magnet holder; and forcing said magnet holder and retained magnet into said magnet receiving cavity thereby embedding said plastic magnet holder and its retained magnet in said article.

2. The method of claim 1 in which the exterior of said side wall or walls of said provided plastic magnet holder comprise at least one reverse sloped exterior retainer ring designed to allow said magnet holder to be press fit into said tight fitting receiving cavity in an article to be fitted with a magnet retained in said housing with said at least one exterior retainer ring engaging the interior wall of said receiving cavity; said exterior retainer ring extending around the perimeter of said housing except for spaced gaps therein such that as one pushes said housing into a tight fitting receiving cavity, air escapes through said gaps, and once said housing is inserted, it is difficult to pull it out because of the tight fit, said rings engaging said interior wall of said receiving cavity.

3. The method of claim 2 in which each of said gaps in said exterior retainer ring is relatively narrow, said gaps occupying from about 10 to about 20% of the perimeter of each said exterior retainer ring.

4. The method of claim 3 in which said top wall of said provided plastic magnet holder is sufficiently thin that a smaller magnet can be used to achieve the same attractive force as a larger magnet behind a thicker wall.

5. The method of claim 1 in which said top wall of said provided plastic magnet holder is sufficiently thin that a smaller magnet can be used to achieve the same attractive force as a larger magnet behind a thicker wall.

* * * * *